United States Patent
Ebsen et al.

(10) Patent No.: US 10,068,663 B1
(45) Date of Patent: Sep. 4, 2018

(54) DATA STORAGE DEVICE WITH REWRITEABLE IN-PLACE MEMORY

(71) Applicant: Seagate Technology, LLC, Cupertino, CA (US)

(72) Inventors: David S. Ebsen, Minnetonka, MN (US); Mark Ish, Sandy Springs, GA (US); Timothy Canepa, Los Gatos, CA (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 15/607,801

(22) Filed: May 30, 2017

(51) Int. Cl.
| | |
|---|---|
| G11C 8/10 | (2006.01) |
| G11C 29/00 | (2006.01) |
| G06F 12/02 | (2006.01) |
| G11C 11/406 | (2006.01) |
| G11C 7/18 | (2006.01) |
| G11C 8/14 | (2006.01) |

(52) U.S. Cl.
CPC ........ G11C 29/789 (2013.01); G06F 12/0238 (2013.01); G11C 8/10 (2013.01); G11C 11/40607 (2013.01); G11C 7/18 (2013.01); G11C 8/14 (2013.01)

(58) Field of Classification Search
CPC .................................. G11C 7/106; G11C 8/10
USPC ........................................ 365/189.05, 230.06
See application file for complete search history.

(56) References Cited

U.S. PATENT DOCUMENTS

| | | | |
|---|---|---|---|
| 6,188,619 B1* | 2/2001 | Jung | G11C 8/12 365/200 |
| 6,236,593 B1* | 5/2001 | Hong | G11C 16/10 365/185.11 |
| 6,334,174 B1 | 12/2001 | Delp et al. | |
| 6,374,323 B1 | 4/2002 | Stracovsky et al. | |
| 6,795,338 B2 | 9/2004 | Parkinson et al. | |
| 6,891,748 B2 | 5/2005 | Tsuchida et al. | |
| 7,835,170 B2 | 11/2010 | Bertin et al. | |
| 8,144,506 B2 | 3/2012 | Wells et al. | |
| 8,200,887 B2* | 6/2012 | Bennett | G06F 11/1068 365/145 |
| 8,225,031 B2 | 7/2012 | Lee et al. | |
| 9,025,370 B2 | 5/2015 | Well et al. | |
| 9,245,926 B2 | 1/2016 | Kau et al. | |
| 9,361,979 B2 | 6/2016 | Wells et al. | |
| 9,368,554 B2 | 6/2016 | Kau et al. | |
| 9,508,427 B2 | 11/2016 | Dodge | |
| 9,520,188 B2 | 12/2016 | Toda | |
| 9,576,659 B2 | 2/2017 | Kau et al. | |
| 9,601,193 B1 | 3/2017 | Zeng et al. | |
| 2008/0266991 A1* | 10/2008 | Lee | G06F 11/1044 365/203 |
| 2014/0013048 A1* | 1/2014 | Biederman | G06F 3/0689 711/114 |

(Continued)

Primary Examiner — Michael Tran
(74) Attorney, Agent, or Firm — Hall Estill Attorneys at Law

(57) ABSTRACT

A non-volatile memory may be resident in a data storage device. The non-volatile memory can consist of a rewritable in-place memory cell having a read-write asymmetry. The non-volatile memory may be divided into a first group of tiers with a selection module of the data storage device prior to adapting to an event by altering the non-volatile memory into a second group of tiers. The first and second groups of tiers being different.

20 Claims, 5 Drawing Sheets

(56) References Cited

U.S. PATENT DOCUMENTS

| | | |
|---|---|---|
| 2014/0095775 A1* | 4/2014 | Talagala .............. G06F 12/0866 |
| | | 711/103 |
| 2014/0304475 A1 | 10/2014 | Ramanujan et al. |
| 2014/0325262 A1* | 10/2014 | Cooper ................ G06F 11/108 |
| | | 714/6.22 |
| 2015/0092494 A1* | 4/2015 | Rhie ...................... G11C 16/16 |
| | | 365/185.12 |
| 2015/0324284 A1* | 11/2015 | Kim ................... G06F 12/0246 |
| | | 711/103 |
| 2015/0370493 A1* | 12/2015 | Choi .................... G06F 3/0619 |
| | | 711/103 |
| 2016/0018988 A1* | 1/2016 | Guyot ................ G11C 13/0004 |
| | | 711/102 |
| 2016/0048459 A1* | 2/2016 | Oh ........................ G06F 12/145 |
| | | 711/103 |
| 2016/0070506 A1* | 3/2016 | Blaettler ............. G06F 11/1048 |
| | | 711/154 |
| 2016/0232112 A1 | 8/2016 | Lee |
| 2016/0259732 A1 | 9/2016 | Mukherjee |
| 2017/0076794 A1 | 3/2017 | Zeng et al. |
| 2017/0235681 A1* | 8/2017 | Kaburaki ............ G06F 12/0292 |
| | | 711/128 |

* cited by examiner

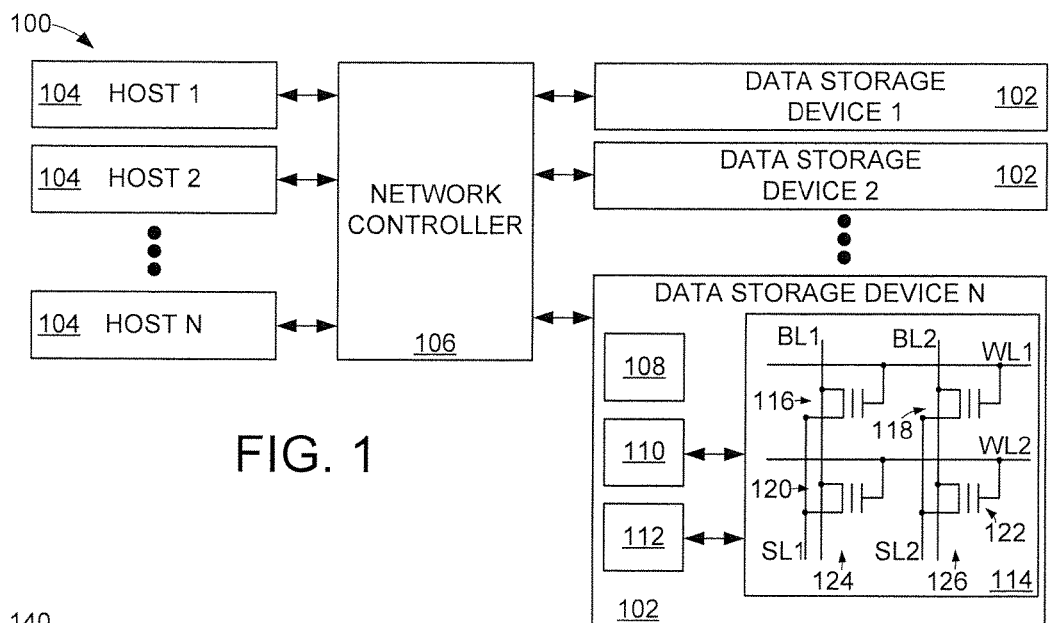
FIG. 1
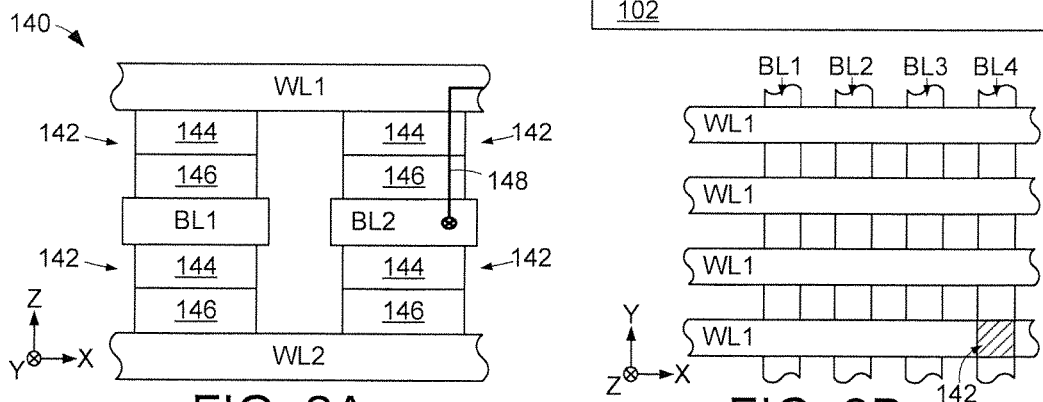
FIG. 2A
FIG. 2B
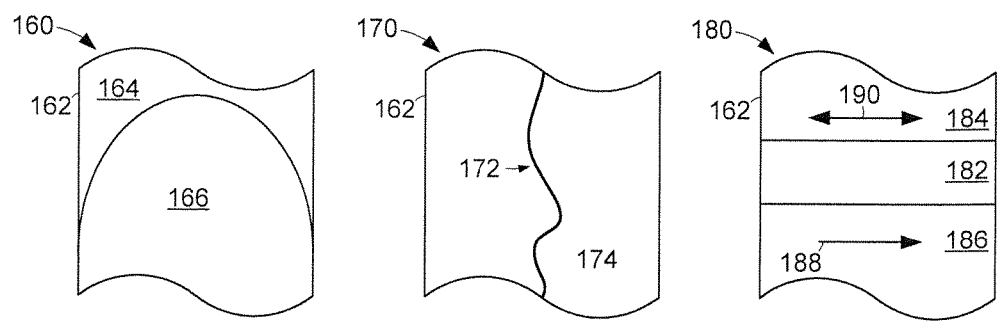
FIG. 3A
FIG. 3B
FIG. 3C

DATA STORAGE DEVICE WITH REWRITEABLE IN-PLACE MEMORY

SUMMARY

A data storage device, in accordance with various embodiments, has a non-volatile memory that consist of a rewritable in-place memory cell having a read-write asymmetry. The non-volatile memory is divided into a first group of tiers with a selection module of the data storage device prior to adapting to an event by altering the non-volatile memory into a second group of tiers. The first and second groups of tiers being different.

BRIEF DESCRIPTION OF THE DRAWINGS

FIG. 1 displays a block representation of an example data storage system in which various embodiments may be practiced.

FIGS. 2A and 2B respectively represent portions of an example data storage device that may be employed in the data storage system of FIG. 1.

FIGS. 3A-3C respectively depict portions of an example memory cell that may be utilized in the data storage system of FIG. 1.

DETAILED DESCRIPTION

Figure 4:
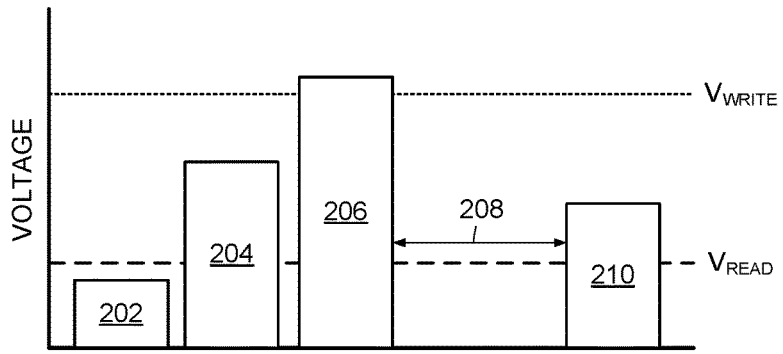
FIG. 4 plots example operational data associated with the data storage system of FIG. 1.

With increasing amounts of data being generated, transferred, and stored, the speed, cost, size, and longevity of data storage has become stressed. While a hard disk drive (HDD) employing rotating magnetic media can reliably store data for long periods of time, the relatively large physical size and slow data access speeds have hampered the adoption of HDD in many computing devices. Solid-state drives that employ NAND flash memory can provide faster data access speeds and smaller physical sizes, but with a greater cost and low longevity than HDD.

The relatively short longevity of flash memory has been exacerbated by data management structures and schemes that write, move, and delete data repeatedly in an effort to decrease data access latency. The fact that flash memory is not bit or byte addressable and instead is merely page/sector addressable compounds the short longevity of the memory and results in complex data management and relatively long data access times compared to volatile memories that are bit/byte addressable. However, the requirement of volatile memories to continuously have power to retain data restricts the potential applicability of these types of memory in a data storage device.

Accordingly, various embodiments are generally directed to data storage structures and operations that utilize rewritable in-place memory that enjoys faster data access speeds than flash memory, smaller physical size than HDDs, and non-volatile data retention. The ability to store data in non-volatile memory with relatively fast data access speeds allows for a diverse variety of data management structures and schemes that can optimize data retention, reading, and writing. Meanwhile, the relatively small physical size of rewritable in-place memory allows a data storage device to be small enough to be implemented in modern computing devices, such as smartphones and tablet computers, while being robust enough to be employed in large data capacity centers.

FIG. 1 displays an example data storage system 100 in which assorted embodiments of the present disclosure may be practiced. The system 100 can connect any number of data storage device 102 to any number of host 104 via a wired and/or wireless network. One or more network controller 106 can be hardware or software based and provide data request processing and distribution to the various connected data storage devices 102. It is noted that the multiple data storage devices 102 may be similar, or dissimilar, types of memory with different data capacities, operating parameters, and data access speeds.

In some embodiments, at least one data storage device 102 of the system 100 has a local processor 108, such as a microprocessor or programmable controller, connected to an on-chip buffer 110, such as static random access memory (SRAM), and an off-chip buffer 112, such as dynamic random access memory (DRAM), and a non-volatile memory array 114. The non-limiting embodiment of FIG. 1 arranges the non-volatile memory array 114 comprises NAND flash memory that is partially shown schematically with first (BL1) and second (BL2) bit lines operating with first (WL1) and second (WL2) word lines and first (SL1) and second (SL2) source lines to write and read data stored in first 116, second 118, third 120, and fourth 122 flash cells.

It is noted that the respective bit lines correspond with first 124 and second 126 pages of memory that are the minimum resolution of the memory array 114. That is, the construction of the flash memory prevents the flash cells from being individually rewritable in-place and instead are rewritable on a page-by-page basis. Such low data resolution, along with the fact that flash memory wears out after a number of write/rewrite cycles, corresponds with numerous performance bottlenecks and operational inefficiencies compared to memory with cells that are bit addressable while being individually accessible and individually rewritable in-place. Hence, various embodiments are directed to implementing bit addressable, rewritable in-place memory into a data storage device 102 that may be part of a distributed network data storage system 100.

FIGS. 2A and 2B represent portions of an example memory array 140 that may be utilized in a data storage device in accordance with various embodiments. The memory array 140 has a plurality of separate memory cells 142 vertically stacked along the Z axis as part of a three dimensional array. While it is contemplated that a single die of memory cells 142 can be utilized, such configuration has diminished data capacity and fails to utilize the all the available space. Hence, various embodiments vertically stack multiple die of memory cells 142 that each reside in the X-Y plane. In yet, the vertically stacked cells 142 are not, necessarily, required to be vertically aligned in the manner shown in FIG. 2A.

With NAND flash memory and other solid-state data storage cells, a transistor or other separate selection component is incorporated into each cell, which occupies valuable real estate, consumes extra power, and adds latency to data access operations. Each memory cell 142 of the memory array 140 is constructed without a transistor or other physically separate selection component and instead has a selection layer 144 contacting a resistive unit 146. The selection layer 144 can be a single material or a lamination of different materials that prevent electrical flow to the resistive unit 146 at predetermined times and allows electrical flow to the resistive unit 146 at other predetermined times. As a non-limiting example, the selection layer 144 can be a metal-insulator transition (MIT) material, an ovonic threshold switch (OTS), or other voltage regulating structure.

The inclusion of a transistor or other selection component, as shown in FIG. 1, corresponds with a source line that activates the respective selection component. The elimination of any selection components in favor of the selection layer 144 allows the vertically stacked memory cells 142 to be individually accessible by a cross-point interconnect configuration where bit lines (BL) operate with word lines (WL) to access one or more cells 142. As illustrated by line 148 an induced electrical potential difference between the bit line and word line induces electrical flow through a single memory cell 142. The ability to select a single bit, hence bit addressable, allows the memory array 140 to densely package the cells without concern for inadvertent accessing of memory cells 142.

It is noted that the construction of the memory cells 142 provides for relatively low power consumption, which corresponds with low risk of disturb of non-selected and physically adjacent cells 142 during read and/or write operations. The top view of FIG. 2B conveys how the memory cells 142 can be positioned with respect to assorted bit and word lines alone a single die. By utilizing bit lines between vertically stacked memory cells 142, the overall number of control interconnects can be reduced, which provides a more densely packaged memory array 140.

FIGS. 3A-3C respectively convey line representations of example non-volatile resistive units capable of being utilized in the memory array 140. FIG. 3A represents a phase change type resistive unit 160 the occupies a resistive region 162 with a chalcogenide glass material 164 that reacts to current to transition between an amorphous 166, low resistivity state and a crystalline, high resistivity state. The switching between polycrystalline and amorphous states can reliably be cycled efficiently. However, the writing/switching current can be relatively high for the phase change resistive unit 160.

FIG. 3B represents a filament type resistive unit 170 where the resistive region 162 comprises a material that has a high resistivity until one or more electrically conductive filaments 172 are induced by the flow of a writing current through the region 162. The formation of filaments can be simple and efficient, but it is contemplated that filament(s) may become engrained in the dielectric material 174 and reduce the margin between high and low resistivity states.

The formation of conductive pathways in the phase change 160 and filament 170 type units may be efficient in some data storage arrangements, but not necessarily all memory arrays. Accordingly, a resistive unit may create different resistive states via relative magnetic orientations. The magnetic type resistive unit 180 of FIG. 3C shows how a dielectric spacer layer 182 is disposed between a magnetic free layer 184 and a magnetic reference layer 186. The reference layer 186 is set to a fixed magnetization 188 while the free layer 184 can be set to multiple different magnetic orientations 190 that, relative to the fixed magnetization 188, provide different resistive states for the unit 180. It is contemplated that the resistive unit 180 may have additional spin polarizing layers, such as in a spin torque arrangement, that function to make the switching of the free magnetization 188 more efficient.

The ability to utilize different types of resistive units in a memory array allows a data storage device to customize the operation and data storing capabilities of a data storage device. As a non-limiting example, a memory array may employ different types of resistive units in different die, which can provide a selectable diversity of operating conditions and data storage parameters. Regardless of the type or diversity of resistive unit in a memory array, a memory cell may suffer from asymmetric access where a write operation takes a different amount of time to complete than a read operation. That is, the replacement of a separate selecting component, such as a transistor or diode, for the selection layer 144 can result in asymmetric access. Such asymmetric access can be problematic in data storage devices where high volumes of data writes and reads can be conducted without concern or evaluation of if a previous read or write operation has completed.

For memory arrays employing phase change type resistive units 160, it is noted that a write access can take considerably more time to complete than a read, such as 7 microsecond latency for a read and 10+ microsecond latency for a write. It is contemplated that the read/write asymmetry can be even larger, such as double or even an order of magnitude longer for a write operation to complete compared to a read operation. These issues have created interesting data management situations that are not addressed in volatile memory, HDD storage, or NAND flash storage.

FIG. 4 plots example operational data of voltage over time associated with a memory array employing asymmetric memory cells in accordance with various embodiments. The construction of the memory cells of a memory array correspond to a different read ($V_{READ}$) and write ($V_{WRITE}$) threshold voltages to respectively access or modify the resistive state, and associated binary state, of a memory cell.

In the event a first voltage 202 is received by one or more memory cells that is below both the read and write threshold voltages, the selection layer of each memory cell will prevent the voltage from passing through cell, which prevents inadvertent resistance variations from degrading a data access operations. When a voltage 204/206 is greater than the read threshold voltage, the selection layer of a memory cell allows the voltage to pass through the cell. For voltage 204 that is not great enough to change the resistive state of the resistive unit, the existing resistive state will be read via signals through the orthogonally oriented bit and word lines.

The passage of a write voltage 206 through the memory cell will change the resistive state of the resistive unit. However, there is a settle time 208 after the write voltage passes through the resistive unit for the memory cell to be set to a resistive state that can be accessed with a read voltage 210. The settle time 208 is directly responsible for the read/write asymmetry of a memory cell, as illustrated in FIG. 4. Thus, the relatively high data capacity and fast read latency associated with the memory array 140 can be degraded by the write asymmetry that requires the data storage device to monitor and account for the relatively long settle time for each memory cell every instance where the cell is written.

Figure 5A:
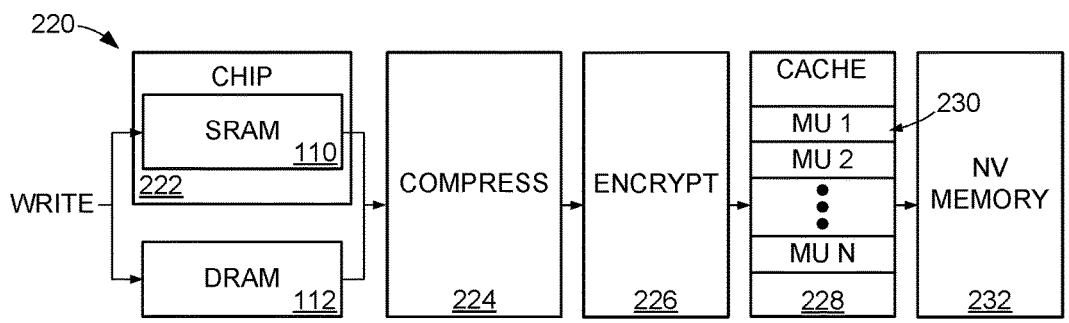
FIGS. 5A and 5B respectively show portions of an example data storage device operated in accordance with various embodiments.
Figure 5B:
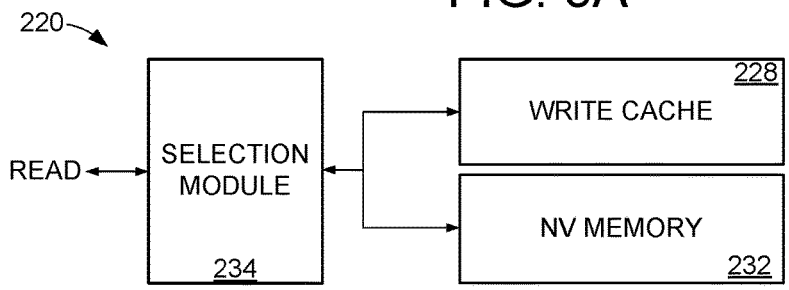

Accordingly, assorted embodiments are directed to structure and methods of optimizing the use of the non-volatile, bit addressable, rewritable in-place memory of FIG. 2 that suffers from asymmetric read/write operations. FIGS. 5A and 5B respectively convey block representations of example write and read operations to a data storage device 220 with the memory array of FIG. 2. A write operation is shown in FIG. 5A and begins with a data of a write request flowing to an SRAM buffer 110 on a wafer chip 222 and/or a DRAM buffer 112 positioned off-chip 222. The write data is then sequentially compressed 224 and encrypted 226 as directed by a local controller executing firmware, software, or hardware operations.

The compressed and encrypted write data is compiled in a write cache 228 as memory units (MU) 230 that can consist of multiple pages and/or sectors of data. It is noted that the compilation of MUs 230 is not required for rewritable in-place non-volatile memories due to individual bits being accessible, as opposed to page accessible flash memory. Regardless of whether the write data is organized into map units 230, the write cache 228 can temporarily store the write data until the data is written to the non-volatile memory (NV MEMORY) 232 where at least a portion of the memory 232 has the asymmetric memory cells 142 of FIG. 2.

With the data written to the asymmetric cells of the non-volatile memory 232, a read operation cannot reliably access the data from the non-volatile memory 232 until after the settle time 208. Therefore, a read operation, in some embodiments, involves a selection module 234 of a data storage device to retrieve data either from the write cache 228 or the non-volatile memory 232, as shown in FIG. 5B. It is noted that the write cache 228 is a different type of memory, such as DRAM or NAND flash, than the non-volatile memory 232 and a read operation will involve decryption and decompression before being sent to a host. Hence, the selection module 234 intelligently manages multiple different types of memory to take advantage of the fast read speed of the non-volatile memory cells 142 of FIG. 2 without suffering from extended write latency due to the settle time of the cells 142.

Figure 6:
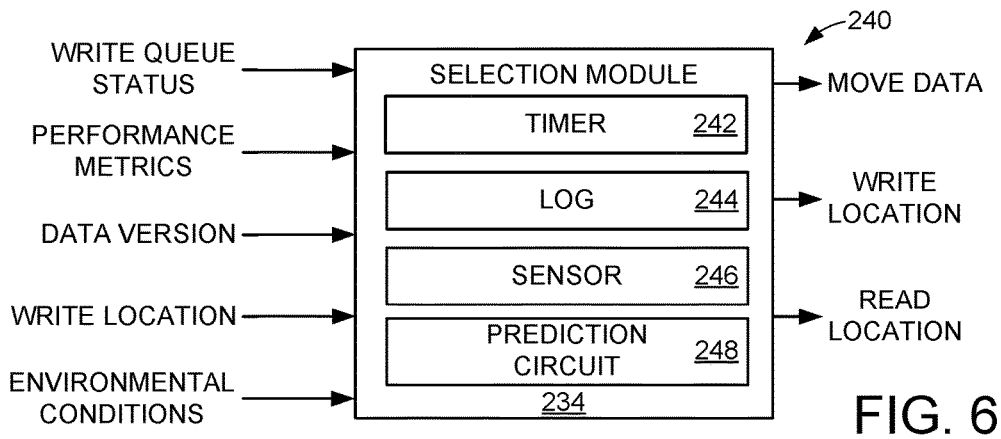
FIG. 6 illustrates a block representation of portions of an example data storage device arranged in accordance with some embodiments.

Although not limiting or required, the selection module 234 can conduct a variety of intelligent evaluations to optimize satisfaction of data accesses from one or more hosts. FIG. 6 is a block representation of a portion of an example data storage device 240 employing the memory array 140 of FIG. 2. The selection module 234 has access to at least a timer 242, activity log 244, sensor 246, and prediction circuit 248 to evaluate the optimal destination and condition for a write or read request to be serviced.

At any time after receiving a write or read request from a host, the selection module 234 can assess the current status of a single data storage device as well as the overall data storage system. Although any type and number of inputs can be concurrently and/or sequentially evaluated by the selection module 234, some embodiments specifically receive the status of pending writes in a write queue, which may be the volume, size, and buffer characteristics of data associated with pending write requests. The selection module 234 may further receive system performance metrics, such as power consumption, average data access latency, and bit error rates.

A designated write location of pending writes along with the version of data provides biographical information about pending data writes to the selection module 234. Any number and type of environmental conditions can be polled, and/or detected with the sensor 246, to identify any potentially adverse data access situations. For instance, a temperature sensor 246 can be used to verify the temperature inside a data storage device compared to a polled ambient temperature received from a remote host. Other environmental conditions, such as humidity, vibrations, and airflow can also be polled and/or sensed to provide a more comprehensive status of the data storage device and system.

The selection module 234 can log the execution and system conditions associated with the servicing data access requests. The collection of information pertaining to previously serviced data access requests allows the selection module 234 to more intelligently react to system conditions and proactively initiate actions to optimize the servicing of future data access requests. That is, the selection module 234 can take current device/system conditions along with data from the log 244 to intelligently identify reactive and proactive actions that can optimize the servicing of pending read and write requests. As a result, the selection module 234 can reactively and proactively move data between volatile buffers and non-volatile memory, alter write locations, and change read locations.

The ability to evaluate and determine the operating status of the data storage device and system to intelligently execute actions to service pending data access request allows the data storage device to adapt to changing conditions and service requests as fast as possible. In regards to the asymmetric rewritable in-place memory, the selection module 234 can intelligently write to the non-volatile memory when there is a lower risk of a read request for the data within the settle time, retain data in a buffer/cache memory to service read requests, and move data to different buffers/cache locations to provide the lowest read latency.

With the selection module 234 reactively and proactively conducting actions to optimize servicing of pending data requests, the current location of valid data can be difficult to discern without a robust mapping scheme. In yet, mapping logical block address (LBA) to physical block address (PBA) as well as LBA to LBA can be expensive in terms of processing and data capacity, particularly in an on-chip SRAM buffer. Mapping can be further complicated with the redundant retention of data in two different locations in order to service read requests for data during the settle time. Accordingly, some embodiments utilize the selection module 234 to designate the storage location, and processing time, for LBA-to-PBA and LBA-to-LBA mapping operations.

Figure 7:
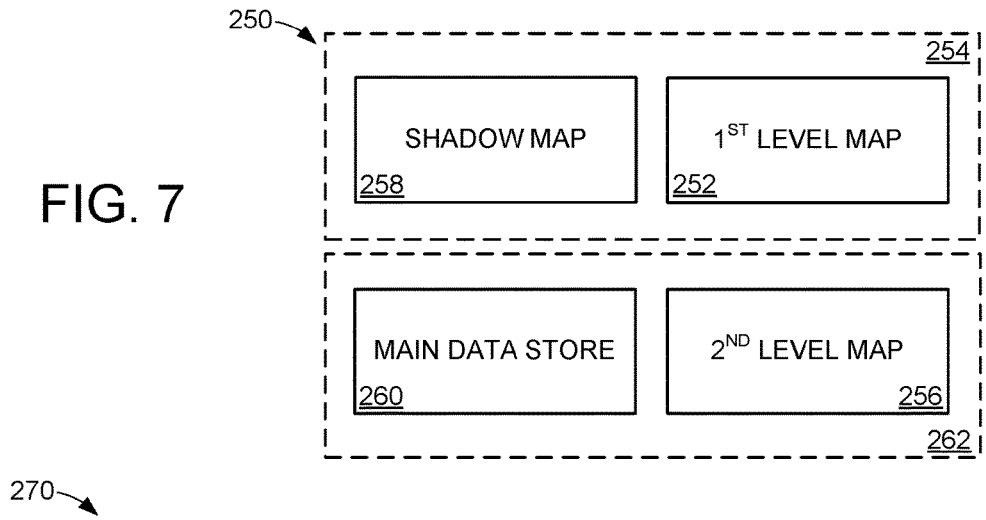
FIG. 7 is a block representation of portions of an example data storage device configured in accordance with assorted embodiments.

FIG. 7 illustrates a block representation of an example mapping scheme 250 that may be implemented in a data storage device employing the memory array 140 of FIG. 2. The presence of multiple different types of memory in a data storage device allows the selection module 234 to generate multiple different data maps to optimize the capabilities, and current status, of the respective types of memory.

In the non-limiting example shown in FIG. 7, the selection module 234 can create a first level map 252 in a first type of memory 254, such as volatile DRAM, SRAM, or non-volatile flash memory. The first level map 252, in some embodiments, comprises at least one LBA-to-PBA boot map that contains entries pointing to granule of 12 entries. The first level map 252 can generally direct a controller to the logical or physical location of a second level map 256 where LBA-to-PBA translations are contained with a greater resolution than the first level map 252. That is, the second level map 256 can comprise local entries pointing to the first granule holding a host-provided data sector. As a result of the first 252 and second 256 level maps, data reads, writes, and updates can be efficiently handled.

The selection module 234 may create a separate shadow map 258 in the first type of memory 254 that contains information about temporary locations of shadow data. It is understood that shadow data is data stored redundantly for a short time period until data is permanently resident in non-volatile memory. The shadow map 258 may be simple, or sophisticated, with one or more versions of data being identified. For instance, successive versions of data may be tracked by the shadow 258, first level 252, and second level 256 to ensure the most recent version of data is retrieved by a read request for the data. It is noted that the shadow 258 and level maps 252/256 may be concurrently written, read, and updated by a common, or dissimilar controllers.

Data that is tracked by the shadow 258 and level maps 252/256 eventually is written to the main data store 260 that is a bit addressable rewritable in-place memory 262. As shown, the main data store 260 and second level map 256 are each stored in the non-volatile rewritable in-place memory 262. However, such configuration is not required or limiting as any number and type of memory can be utilized for the respective maps 252/256/258. For example, the first level map 252 may be stored in serial NOR flash, the shadow map 258 stored in cluster SRAM, and the second level map 256 stored in DDR DRAM. The use of at least two different types of memory 254/262 allows the selection module 234 to intelligently generate and maintain the various maps 252/256/258 in memories that most efficiently allow for the servicing of data read and write requests.

It is contemplated that the selection module 234 can alter the size, purpose, and memory location of the assorted maps 252/256/258 to accommodate changing system and device conditions. The selection module 234 may further alter a memory and/or map via virtualization. That is, the selection module 234 can create virtual machines that independently operate in software/firmware despite being located in a common memory 254/256. Such virtualization capability allows the selection module 234 to adapt in real-time to detected and/or predicted system and device conditions to optimize data read and write latencies.

Figure 8:
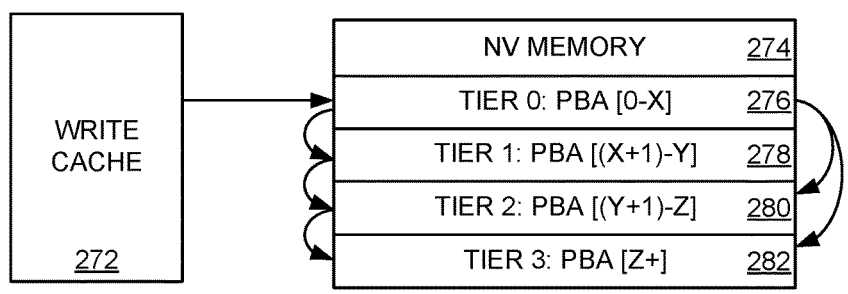
FIG. 8 displays a block representation of a portion of an example data storage device that may be employed in the data storage system of FIG. 1.

FIG. 8 illustrates a block representation of a portion of an example data storage device 270 that employs virtualization of memory in accordance with various embodiments. One or more different write cache 272 can feed into a non-volatile memory 274 that comprises bit addressable rewritable in-place memory, such as array 140. While a data storage device 270 may consist of multiple separate non-volatile memories 274, some embodiments contain a single non-volatile memory 274 logically separated into different memory tiers, which can be characterized as virtualized storage.

A memory 274 can be virtualized into any number of tiers that are mapped by at least one level map 252/256 and potentially a shadow map 258. Although not required or limiting, the virtualized storage scheme shown in FIG. 8 is hierarchical in nature and has a first tier 276 assigned to a first PBA range, a second tier 278 assigned to a second PBA range, a third tier 280 assigned to a third PBA range, and fourth tier 282 assigned to a fourth PBA range. The non-overlapping ranges of the respective tiers 276/278/280/282 may, alternatively, be assigned to LBAs.

As shown by solid arrows, data may flow between any virtualized tiers as directed by a selection module and/or local controller. For instance, data may consecutively move through the respective tiers 276/278/280/282 depending on the amount of updating activity, which results in the least accessed data being resident in the fourth tier 282 while the most frequently updated data is resident in the first tier 276. Another non-limiting example involves initially placing data in the first tier 276 before moving the data to other, potentially non-consecutive, tiers to allow for more efficient storage and retrieval, such as based on data size, security, and/or host origin.

It can be appreciated that the rewritable in-place memory of the non-volatile memory 274 allows for the adaptive virtualization of the respective tiers 276/278/280/282. That is, the ability to write data to a specific bit, byte, and sector without having to store non-selected data of a common page allows the virtualized tiers to have evolving sizes, assigned contents, and existence based on the system and device needs determined by the selection module 234. Therefore, the virtualized scheme of FIG. 8 may be altered in any way over time by the selection module 234 to optimize data storage for the real-time conditions of the data storage system and device.

Figure 9:
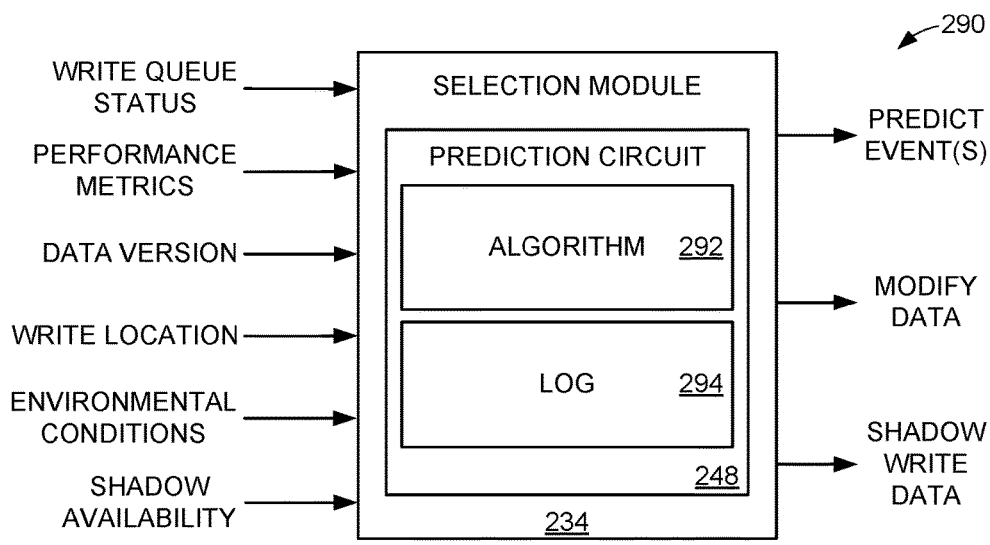
FIG. 9 depicts a block representation of a portion of an example data storage device arranged in accordance with some embodiments.

The virtualization of portions of a non-volatile memory 274 is complemented by the capability of a selection module 234 to take proactive actions to meet forecasted data storage activity and/or operational events. FIG. 9 depicts a block representation of a portion of an example data storage device 290 that employs a selection module 234 having a prediction circuit 248 operated in accordance with various embodiments. The prediction circuit 248 can detect and/or poll a diverse variety of information pertaining to current, and past, data storage operations as well as environmental conditions during such operations. It is noted that the prediction circuit 248 may utilize one or more real-time sensors 246 of the selection module 234 to detect one or more different environmental conditions, such as device operating temperature, ambient temperature, and power consumption.

With the concurrent and/or sequential input of one or more parameters, as shown in FIG. 9, the prediction circuit 248 can forecast the occurrence of future events that can be accommodated as directed by the selection module 234. For instance, the selection module 234 can modify data, such as data size, location, and security to accommodate a predicted event. In another non-limiting instance, the selection module 234 can direct the redundant writing of shadow data to one or more locations other than the non-volatile memory, which can provide efficient reading of data while the non-volatile memory is within its settle time.

Although not exhaustive, the prediction circuit 248 can receive information about the current status of a write queue, such as the volume and size of the respective pending write requests in the queue. The prediction circuit 248 may also poll, or determine, any number of system/device performance metrics, like write latency, read latency, and error rate. The version of data pending, or being written, may be evaluated by the prediction circuit 248 to establish how frequently data is being updated. The assigned write location of pending and previously completed data writes may be utilized by the prediction circuit 248 to perform wear leveling operations in non-volatile memory.

One or more environmental conditions can be sensed in real-time and/or polled by the prediction circuit 248 to determine trends and situations that likely indicate future data storage activity. The availability of space in one or more shadow buffers, such as SRAM or NOR flash, may identify to the prediction circuit 248 the performance of the buffer(s) along with indicating the system's capacity to handle future pending write requests. The prediction circuit 248 can employ one or more algorithms 292 and at least one log 294 of previous data storage activity to forecast the events and accommodating actions that can optimize the servicing of read and write requests.

It is contemplated that the log 294 consists of both previously recorded and externally modeled events, actions, and system conditions. The logged information can be useful to the selection module 234 in determining the accuracy of predicted events and the effectiveness of proactively taken actions. Such self-assessment can be used to update the algorithm(s) 292 to improve the accuracy of predicted events. By determining the accuracy of previously predicted events, the prediction module 248 can assess a risk that a predicted action will occur and/or the chances of the accommodating actions will optimize system performance. Such ability allows for the prediction module 248 to operate with respect to thresholds established by the selection module 234 to ignore predicted events and proactive actions that are less likely to increase system performance, such a 95% confidence that an event will happen or a 90% chance a proactive action will increase system performance.

With the ability to ignore less than likely predicted events and proactive actions, the selection module 234 can concurrently and sequentially generate numerous different scenarios, such as with different algorithms 292 and/or logs 294. As a non-limiting example, the prediction circuit 248 may be tasked with predicting events, and corresponding correcting actions, based on modeled logs alone, real-time system conditions alone, and a combination of modeled and real-time information. Accordingly, the prediction circuit 248 and selection module 234 can assess system conditions to generate reactive and proactive actions that have a high chance of improving the servicing of current, and future, data access requests to a data storage device.

Figure 10A:
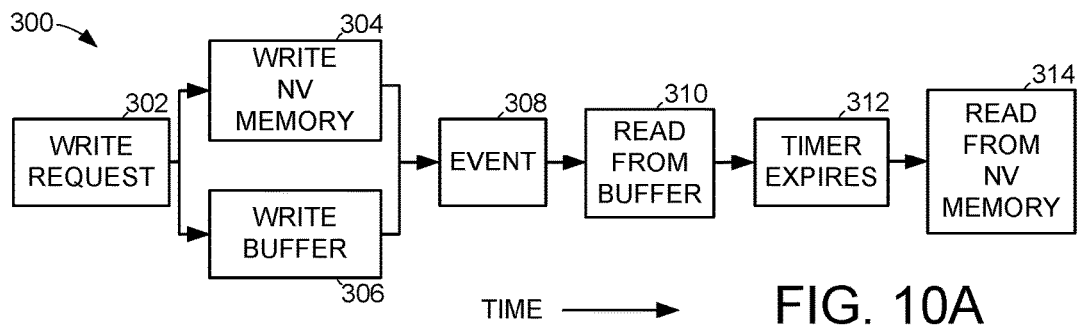
FIGS. 10A-10D respectively represent of a portion of an example lithographic assembly formed in accordance with assorted embodiments.

FIGS. 10A-10D respectively convey example operational schemes resulting from the intelligent operation of the selection module 234 over time. FIG. 10A shows scheme 300 where a pending write request 302 is concurrently written to non-volatile memory in step 304 and at least one write buffer in step 306. An actual, or predicted, event in step 308 may trigger the selection module 234 to read data from the buffer in step 310 until a timer expires in step 312. In other words, the redundant writing of data allows for reading of the data from the buffer in step 310 while the non-volatile memory is in its settle time and subsequently from the non-volatile memory in step 314.

In scheme 300, the event of step 308 may be a longer than average settle time, perhaps due to device temperature, or other operating condition that calls for the reading of data during the settle time of the non-volatile memory. For example, writing of a multi-level non-volatile memory cell or predicted likelihood that a host will request the recently written data in step 308 can prompt the selection module 234 to direct data retrieval from a temporary buffer. It is contemplated that the timer of step 312 can be for the settle time of the non-volatile memory or for a designated delay time determined by the selection module 234 to more efficiently service data access requests than if no delay was present.

Figure 10B:
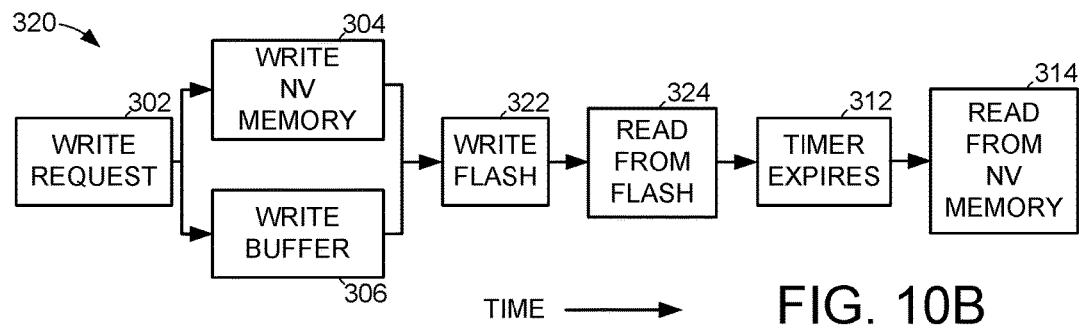

FIG. 10B represents example scheme 320 where the write request of step 302 and writing of data to both non-volatile memory and buffer are the same as scheme 300. However, no actual or predicted event occurs and instead data is written to a flash memory in step 322 and subsequently read from the memory in step 324 until a timer expires in step 312 and data is then read from the non-volatile memory in step 314. The utilization of flash memory in steps 322 and 324 can partially, or completely, empty the write buffer, which can allow the faster write buffer to service other pending system activities.

Figure 10C:
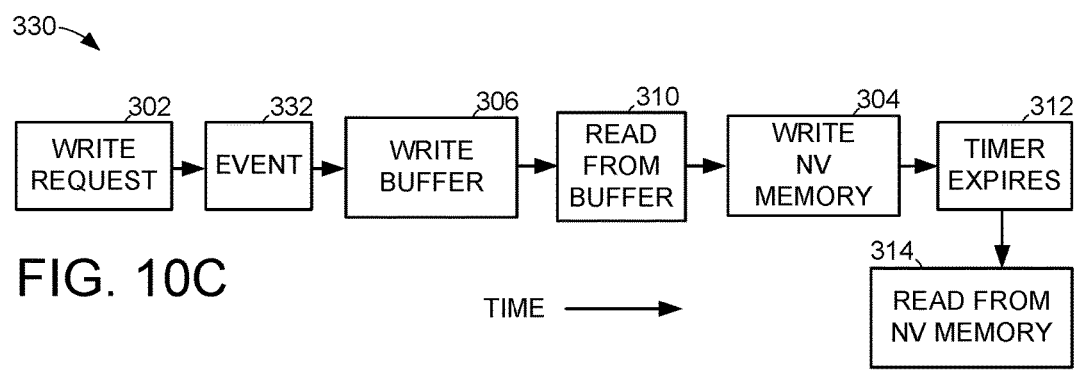

The scheme 330 of FIG. 10C shows how an actual or predicted event in step 332 may occur after receipt of a pending write request to a data storage device. The event can trigger the selection module 234 to forego writing data to the non-volatile memory and instead write only to the write buffer in step 306 and read from the buffer in step 310 while step 304 writes the data to the non-volatile memory. By writing data to the buffer first, then to the non-volatile memory, system resources may be more efficiently used, such as during times of high data read accessing. At the conclusion of the settle time of the non-volatile memory, as represented by the expiration of the timer in step 312, the data is read from the non-volatile memory in step 314.

Some embodiments predict the unscheduled loss, or reduction, of power to the data storage device/system, which triggers the selection module to send all data from a volatile buffer to non-volatile memory. Other embodiments respond to a scheduled reduction in power, such as a shut-down of the device/system, by sending all data to the rewritable in-place non-volatile memory. Since the settle time of the non-volatile memory does not need to be accounted for during a shut-down, the selection module can dump large amounts of data to the non-volatile memory without harm.

The relatively fast read time of the rewritable in-place memory can be intelligently employed during a scheduled shut-down by storing one or more boot maps to the non-volatile memory. It is noted that the selection module 234 may generate a new boot map based on current, and recent, system activity to provide a nearly instant-on boot process where the boot map is loaded exclusively from the non-volatile memory and subsequently the boot map is moved to other memory where updates are more efficiently carried out. By sending existing or newly generated boot data, such as security information, level maps, and firmware, a data storage device/system can be ready to receive new data access requests in less than 1 second from time of power initialization.

Figure 10D:
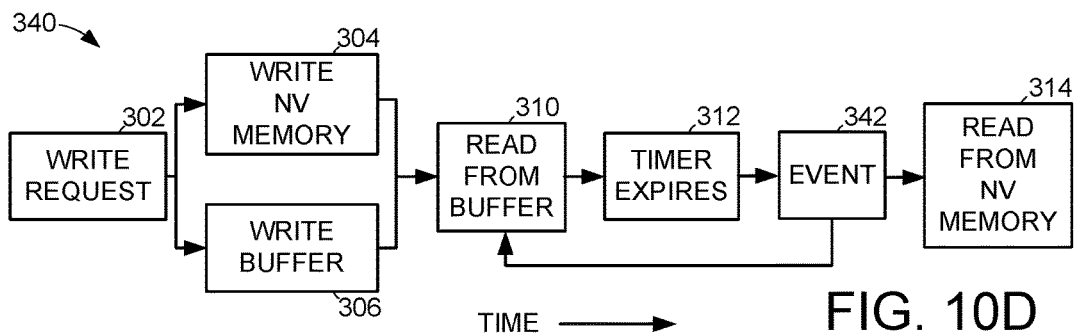

Turning to FIG. 10D, scheme 340 handles the write request from step 302 by concurrently and redundantly writing to the non-volatile memory in step 304 and to a buffer in step 306. While the write to the non-volatile memory settles, step 310 services any reads from the buffer until a selection module 234 timer expires in step 312. A predicted, or encountered, event in step 342 triggers the selection module 234 to continue servicing data read requests from the buffer instead of from the non-volatile memory, despite the data write to the non-volatile memory having settled. The event in step 342 is not limited, but can be any operating condition that may inhibit or degrade data reads from the non-volatile memory, such as an error, high device/system processing activity, or channel availability.

It is contemplated that the selection module 234 can handle overwrite situations during the settle time of a memory cell. In such situations, "Dirty" and "WriteInProgress" flags are added to a cache entry. Although not required or limiting, a Dirty flag indicates the data in the cache has not been written to the non-volatile memory yet and a WriteInProgress flag indicates that the data in the cache has been written to the non-volatile memory, but the cool down period hasn't completed. As a result, the selection module 234 can intelligently assess whether data is currently in a settle phase, which decreases redundant operations and increases system performance.

Through the example schemes of FIGS. 10A-10D, it can be appreciated that the selection module 234 can take a variety of actions to adapt to predicted and/or actual events to optimize the servicing of data access requests. Such intelligent adaptation allows the selection module to maintain high data access bandwidth and low data access latency regardless of the volume of data accesses. The intelligent adaptation further allows the selection module to alter data storage locations, mapping schemes and the writing of shadow data to accommodate changes in data priority and security, which can send highly important data to non-volatile data more quickly.

Figure 11:
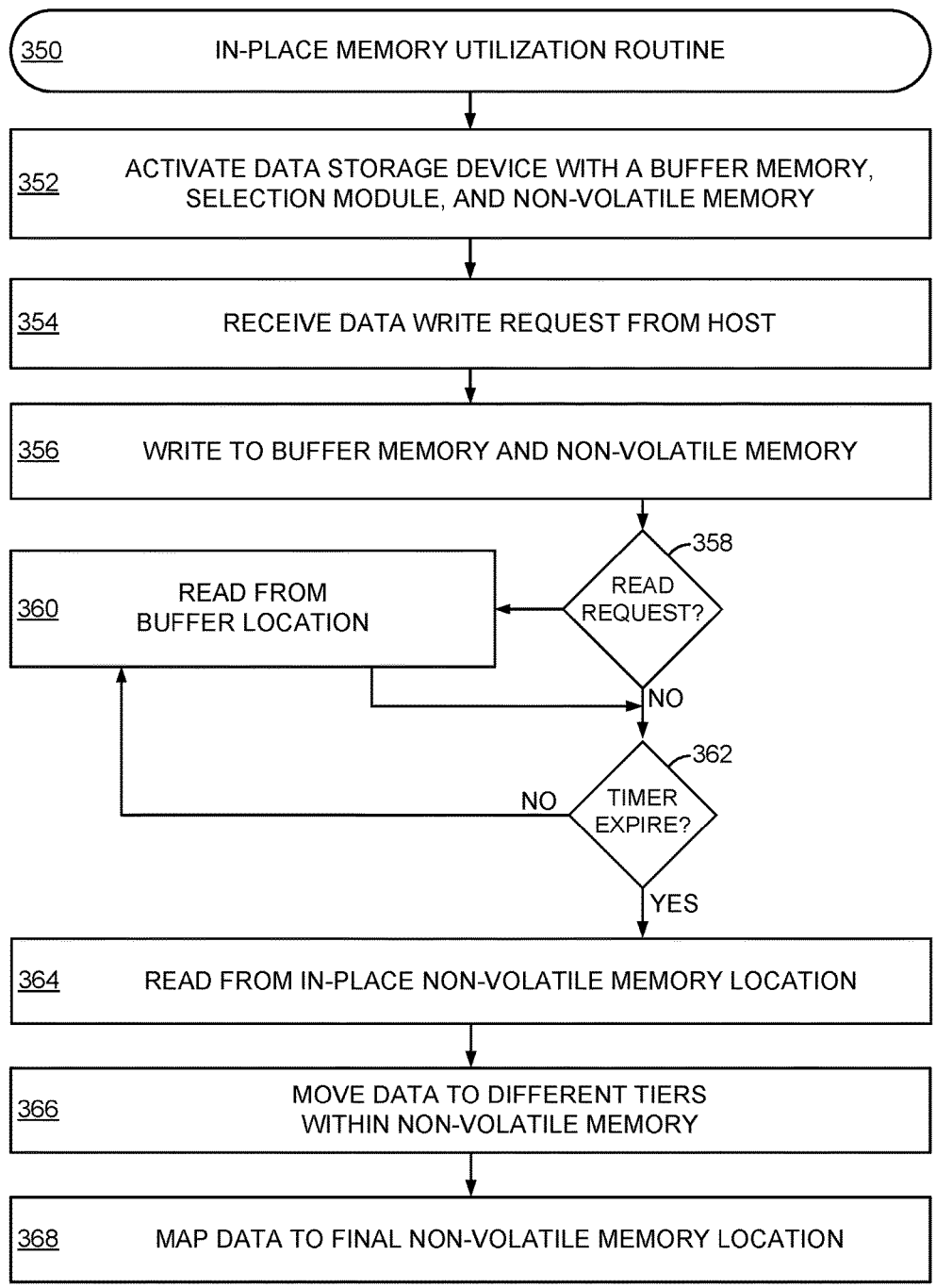
FIG. 11 is a flowchart of an example in-place memory utilization routine executed with the data storage system of FIG. 1 in accordance with some embodiments.

FIG. 11 is a flowchart of an example in-place memory utilization routine 350 that can be carried out by the assorted embodiments of FIGS. 1-10D. One or more data storage devices can be activated in step 352 with each data storage device consisting of a selection module, buffer memory, and a rewriteable in-place non-volatile memory. The data storage devices can operate for any amount of time as part of a distributed network in a data storage system. When at least one data storage device receives one or more data write request from a host in step 354, the selection module can write the data associated with the pending data request to at least one buffer memory and the non-volatile memory in step 356.

The programming of the write data in step 356 can be done concurrently or sequentially to the buffer and non-volatile memories. However, when the data is written to the non-volatile memory, the selection module begins a timer to determine when the memory cells will finish settling and be available to service a read request. In some embodiments, step 356 involves the prediction of a settle time that differs from a preexisting default settle time, such as in reaction to high device temperatures and/or activity around the physical location of the data destination.

At any time during and after the writing of data to the non-volatile memory in step 356, decision 358 can field read requests for that data with the selection module. That is, if a read request is received by the selection module while the non-volatile memory is in its settle time, step 360 proceeds to service the read request from data stored in the buffer. At the conclusion of the any read requests serviced with step 360, or in the event no read request is received from decision 358, decision 362 proceeds to evaluate if the selection module timer has expired.

An expired selection module timer allows step 364 to service a read request from the non-volatile memory while an active timer proceeds back to step 360 where the buffer location is used for any read request. It is noted that steps and decisions 354-364 can be cyclically revisited any number of times to handle data read and write requests. At any time after data is written in step 354, step 366 can move data between actual or virtualized tiers within the non-volatile memory. In yet, such data transfer is not required. The final non-volatile memory location is subsequently mapped in step 368 to direct any read operations to the most current version of data stored in the non-volatile memory. It is noted that the mapping of data in step 368 may correspond with the removal, or scheduled removal, of data from each buffer and from the shadow map directing data access to the buffer.

Through the various embodiments of the present disclosure, a non-volatile rewritable in-place memory can be utilized to optimize the servicing of data access requests. However, due to the asymmetrical write time associated with the rewriteable in-place memory, a selection module intelligently evaluates current and logged system activity to allow the servicing of read requests for data settling in the non-volatile memory. The selection module allows for reactive and proactive actions to be taken to maintain, and optimize, system performance in response to actual and forecasted events. As a result, the data storage system can enjoy less data read latency, decreased boot times, and sophisticated virtualization schemes that adapt to changing system conditions.

What is claimed is:

1. An apparatus comprising a non-volatile memory resident in a data storage device, the non-volatile memory comprising a rewritable in-place memory cell having a read-write asymmetry, the read-write asymmetry corresponding with a settle time after a data write to the rewritable in-place memory cell, the non-volatile memory divided by a selection module of the data storage device into a first group of tiers prior to an event and into a second group of tiers after the event, the first and second groups of tiers being different.

2. The apparatus of claim 1, wherein the rewritable in-place memory cell comprises a selection layer contacting a resistive unit without a transistor.

3. The apparatus of claim 1, wherein the data storage device has a buffer memory that is a different type of memory than the non-volatile memory.

4. The apparatus of claim 1, wherein the rewritable in-place memory cell does not have a consistent resistive state that can be read during the settle time.

5. The apparatus of claim 1, wherein the first group of tiers has a different number of tiers than the second group of tiers.

6. The apparatus of claim 1, wherein the first and second groups of tiers are each virtualized.

7. The apparatus of claim 1, wherein each tier of the second group of tiers is assigned to a range of physical block addresses.

8. The apparatus of claim 7, wherein the ranges of the respective tiers of the second group of tiers are different and non-overlapping.

9. A method comprising:
activating a non-volatile memory resident in a data storage device, the non-volatile memory comprising a rewritable in-place memory cell having a read-write asymmetry the read-write asymmetry corresponding with a settle time after a data write to the rewritable in-place memory cell;
dividing the non-volatile memory into a first group of tiers with a selection module of the data storage device; and
adapting to an event by altering the non-volatile memory into a second group of tiers, the first and second groups of tiers being different.

10. The method of claim 9, wherein the event is a detected change in operating performance of the data storage device.

11. The method of claim 9, wherein the second group of tiers is arranged into a hierarchical structure.

12. The method of claim 11, wherein a first tier of the second group of tiers is a cache where data is initially stored prior to being moved to other tiers of the second group of tiers.

13. The method of claim 11, wherein the respective tiers of the second group of tiers corresponds with an access frequency of data stored in the respective tiers of the second group of tiers.

14. The method of claim 9, wherein the selection module updates data in the respective tiers of the second group of tiers without moving the data.

15. A method comprising:
activating a non-volatile memory resident in a data storage device, the non-volatile memory comprising a rewritable in-place memory cell having a read-write asymmetry the read-write asymmetry corresponding with a settle time after a data write to the rewritable in-place memory cell;

dividing the non-volatile memory into a first group of tiers with a selection module of the data storage device;

predicting an event with a selection module of the data storage device;

adapting to the event proactively by altering the non-volatile memory into a second group of tiers, the first and second groups of tiers being different.

16. The method of claim 15, wherein the predicted event forecasted by the selection module to hinder a performance parameter of the data storage device.

17. The method of claim 15, wherein the selection module divides data into multiple different tiers of the second group of tiers in response to the predicted event.

18. The method of claim 15, wherein the selection module stripes data across multiple different tiers of the second group of tiers in response to the predicted event.

19. The method of claim 15, wherein the selection module writes a shadow copy of data in a buffer memory of the data storage device that is read throughout a settle time of the non-volatile memory.

20. The method of claim 15, wherein a map tier of the second group of tiers consists of a map of data resident in the non-volatile memory.

* * * * *